United States Patent [19]

Dostalik et al.

[11] Patent Number: 5,268,067
[45] Date of Patent: Dec. 7, 1993

[54] WAFER CLAMPING METHOD

[75] Inventors: William W. Dostalik, Richardson; Lee M. Loewenstein, Plano, both of Tex.

[73] Assignee: Texas Instruments Incorporated, Dallas, Tex.

[21] Appl. No.: 922,596

[22] Filed: Jul. 30, 1992

[51] Int. Cl.$^5$ .............................. H01L 21/00
[52] U.S. Cl. .................... 156/643; 156/345; 118/728; 118/729; 118/500; 269/296; 269/303
[58] Field of Search ............... 156/643, 345; 118/728, 118/729, 500; 269/54.5, 296, 303

[56] References Cited

U.S. PATENT DOCUMENTS 4,872,938 10/1989 Davis .................... 118/729

Primary Examiner—Richard Bueker
Attorney, Agent, or Firm—Richard A. Stoltz; Richard L. Donaldson; William E. Hiller

[57] ABSTRACT

In one embodiment this is a method of clamping semiconductor wafers for processing with the active face down. The method comprises: supporting a face down wafer 10 on an intermediate support 15; placing a clamping surface 14 at least adjacent to a backside of the wafer; moving at least three bevel-edged pins 11 upward to engage the beveled edges 12 with portions of the periphery of the face to press the wafer 10 against the clamping surface 14; moving the intermediate support 15 away from the wafer 10, and removing photoresist from the wafer by ashing the photoresist, whereby photoresist is essentially completely removed and essentially no unremoved photoresist remains to contaminate later processing.

10 Claims, 1 Drawing Sheet

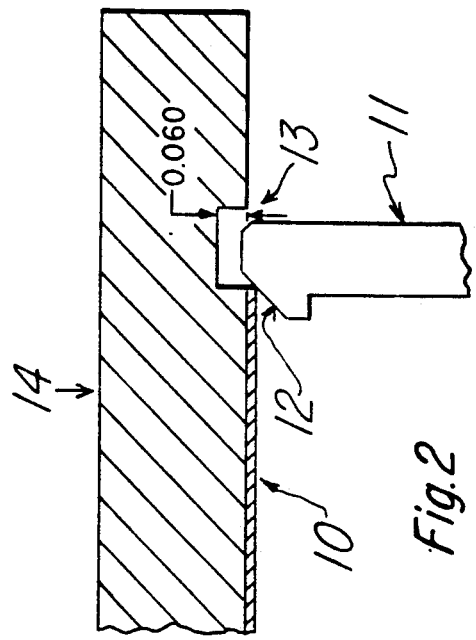
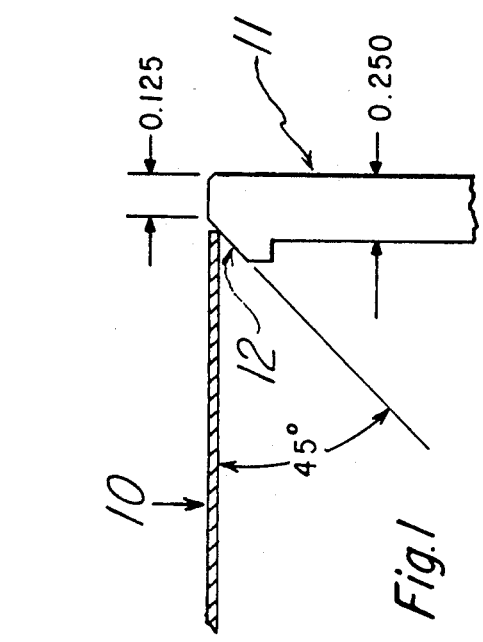
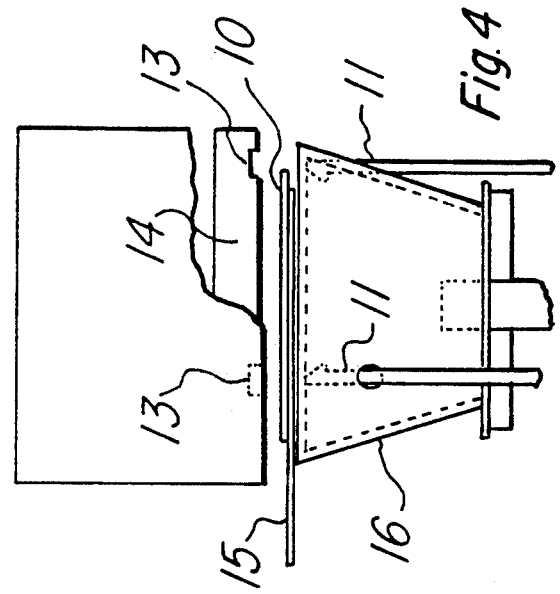
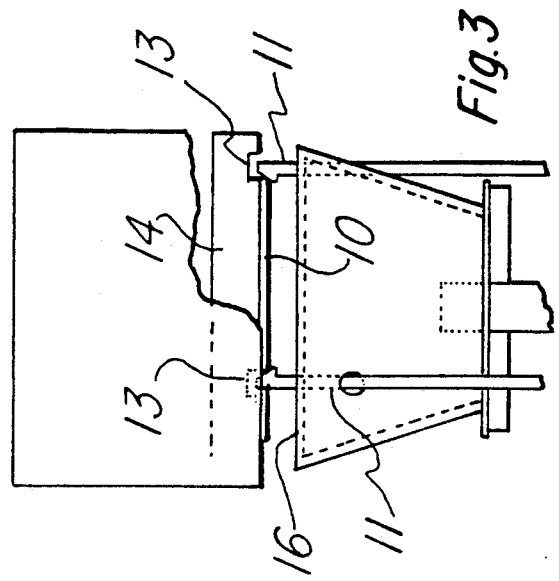

WAFER CLAMPING METHOD

FIELD OF THE INVENTION

This invention generally relates to semiconductor wafer clamping methods, and in particular to methods of clamping wafers, during processing, with the active face down.

BACKGROUND OF THE INVENTION

Without limiting the scope of the invention, its background is described in connection with current methods of clamping semiconductor wafers to a clamping surface, as an example. Wafers have generally been processed with the active face up. Recently however, face down processing has been used to minimize particle contamination on the active surface.

In single wafer processing using face-down processing where the wafer needs support, past practice of clamping the wafer to a another surface has resulted in covering portions of the wafer surface. As a portion of the wafer surface is covered by the clamping device as it overlaps onto the surface, neither deposition nor etching, for example, can take place under the covered portion of the wafer surface. As a result, such wafers generally don't have active devices close to the periphery.

SUMMARY OF THE INVENTION

Problems of prior art clamping for face down processing are two-fold:
(1) Small parts of the wafer surface are lost to device usage (this, however, is generally not serious enough to warrant a change in fixtures);
(2) Material that needs to be removed prior to subsequent processing is not removed and thus can contaminate later processing (although this apparently has not heretofore been recognized, this is a serious problem).

Accordingly, improvements which overcome any or all of the problems are presently desirable. A principle object of the present invention is to provide an improved method of clamping wafers in order to access the entire surface of the wafer.

It is herein recognized that a need exists for a wafer clamping method that does not cover any portion of the wafer's active surface to provide total usage of the wafer surface. The present invention is directed towards meeting those needs.

The invention clamps the wafer against the clamping surface without covering any portion of the wafer surface, thus allowing complete removal (and also deposition or etching) of materials over the entire surface of the wafer face. This is accomplished by the invention holding the wafer by its edge.

An advantage of the invention is the entire surface of the wafer can be utilized. An additional advantage is that contamination due to incomplete removal of material during prior processing is generally avoided. Furthermore, the wafer is self-centering because the beveled-edges of the pins force the wafer into alignment.

This is a method of clamping semiconductor wafers for processing with the active face down. The method comprises: supporting a face down wafer on an intermediate support; placing a clamping surface at least adjacent to a backside of the wafer; moving at least three bevel-edged pins upward to engage the bevel edges with portions of the periphery of the face to press the wafer against the clamping surface; and moving the intermediate support away from the wafer.

Preferably, the bevels are cut at about a 45 degree angle, the semiconductor wafers are silicon, the clamping surface has a groove positioned to receive tips of the pins, the pins are supported by a common frame, and after the intermediate support is moved away, photoresist is removed from the wafer.

In addition, the intermediate support may comprise of at least three support members with flat surfaces which contact the active face and support members may have ends which can extend into the groove. The clamping surface may be a hotplate.

BRIEF DESCRIPTION OF THE DRAWINGS

The foregoing and further aspects of the invention are illustrated in the accompanying drawings wherein like elements are denoted by like reference designators and in which:

FIG. 1 is a cross-section of the wafer in relation to the clamping pin;

FIG. 2 is a cross-section of the wafer and a clamping pin in relation to clamping surface.

FIG. 3 is a elevation view of the wafer, clamping pins, the hotplate, the reactor wall, and an intermediate surface in relation to each other while the wafer is in the up position.

FIG. 4 is a elevation view of the wafer, clamping pins, the hotplate, the reactor wall, and an intermediate surface in relation to each other while the wafer is in the down position.

DETAILED DESCRIPTION OF PREFERRED EMBODIMENTS

This method clamps the wafer without covering any portion of the wafer surface, thus allowing complete removal (and also disposition and etching) of materials over the entire surface of the wafer face. This is accomplished by holding the wafer by its edge.

The clamping device can utilize a set of three thin vertical pins located on the wafer diameter, although the invention is not limited to three pins as the clamping device. Generally, the wafer is oriented horizontally, face down, and the pins have sufficient width to extend slightly inside and slightly outside the wafer diameter. The top edge of each pin is cut to an angle, such that the edge of the wafer will rest on the angle. It is often useful, but not always required, to cut small depressions in the surface to be clamped to allow the pin to reach full extension and securely clamp the wafer.

This method for clamping wafers is also advantageous in that it is self-centering, provided adequate machine tolerances for the individual parts are implemented. That is, the wafer will be forced to the center of the clamping surface.

This design was tested on a remote plasma photoresist asher. Its use allowed complete removal of photoresist from the wafer surface. Without the use of this invention, photoresist was left under the support pins (and thus could contaminate subsequent processing).

When the wafer clamping method was used without the depressions cut into the hotplate, under some circumstances it was found that the wafer was not placed onto the pins perfectly horizontal. With small depressions in the hotplate surface, however it was found that wafers selfaligned to the horizontal. This was determined using a reflected laser signal. The signal was maximized using the hotplate depressions of this invention.

In FIG. 1, a clamping device 11 is shown in relation to a semiconductor wafer 10. The clamping device 11 is at a perpendicular angle to the wafer 10. The clamping device edge 12, which is against the wafer's 10 edge is beveled at a 45 degree angle. The clamping device 10 overlaps the inside of the wafer and also hangs over the edge of the wafer. Three clamping pins are used in the photoresist asher example as the clamping device 11, but the invention is not limited to three clamping pins 11.

In FIG. 2, the clamping device 11 and the semiconductor wafer 10 is shown in relation to another surface 14. The clamping device 11 is directed in a perpendicular direction towards the wafer surface. The clamping device 11 is shown to overlap the inside of the wafer 10 also hang over the edge of the wafer 10. The depression 13 allows the clamping device 11 to hang over the edge of the wafer 10. The depression 13 along with the beveled edge of the clamping device 11 allows the entire surface of the wafer 10 to be utilized because the only point or line of contact is the edge of the wafer. The beveled edge 12 of the clamping device 11 allows for minimum contact and does not contact the surface of the wafer 10. Since the surface is totally accessible, all materials that need to be added or removed are not obstructed by the clamping pins.

In FIG. 3, the hotplate 14 shows the indentations 13 which allow the fully extended clamping pins 11 in the up position to clamp the wafer 10 to the hotplate 14. The clamping pins 11 are shown extending through the reactor wall 16 and the wafer 10 is not supported by the retracted intermediate support (not shown).

In FIG. 4, is similar FIG. 3. The hotplate 14 is shown with the indentations 13. The reactor wall 16 is below the hotplate 14. The clamping pins 11 are shown lower than the intermediate support 15. The wafer 10 rests entirely on the intermediate support 15.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of clamping semiconductor wafers for processing with the active face down, wherein the face has a periphery, said method comprising:
   a. supporting a face down wafer on an intermediate support;
   b. placing a clamping surface at least adjacent to a backside of said wafer;
   c. moving at least three bevel-edged pins upward to engage said beveled edges with portions of the periphery of said face to press said wafer against said clamping surface; and
   d. moving said intermediate support away from said wafer.

2. The method of claim 1, wherein said bevels are cut at about a 45 degree angle.

3. The method of claim 1, wherein said semiconductor wafers are silicon.

4. The method of claim 1, wherein the clamping surface is a hotplate.

5. The method of claim 1, wherein the clamping surface has a depression positioned to receive tips of said pins.

6. The method of claim 1, wherein after said intermediate support is moved away, photoresist is removed from said wafer.

7. The method of claim 5, wherein said intermediate support comprises of at least three support members with flat surfaces which contact said active face.

8. The method of claim 7, wherein support members have ends which can extend into said groove.

9. The method of claim 1, wherein said pins are supported by a common frame.

10. A method of clamping semiconductor wafers for processing with the active face down, wherein the face has a periphery, said method comprising:
   a. supporting a face down wafer on an intermediate support;
   b. placing a clamping surface at least adjacent to a backside of said wafer;
   c. moving at least three bevel-edged pins upward to engage said bevel edges with portions of the periphery of said face to press said wafer against said clamping surface; and
   d. moving said intermediate support away from said wafer, and
   e. removing photoresist from said wafer by ashing said photoresist, whereby photoresist is essentially completely removed and essentially no unremoved photoresist remains to contaminate later processing.

* * * * *